(12) United States Patent
Iida

(10) Patent No.: US 8,345,506 B2
(45) Date of Patent: Jan. 1, 2013

(54) SEMICONDUCTOR MEMORY DEVICE

(75) Inventor: Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 13/100,939

(22) Filed: May 4, 2011

(65) Prior Publication Data

US 2011/0205829 A1 Aug. 25, 2011

Related U.S. Application Data

(63) Continuation of application No. PCT/JP2009/000756, filed on Feb. 23, 2009.

(30) Foreign Application Priority Data

Nov. 26, 2008 (JP) ................................. 2008-300972

(51) Int. Cl.
G11C 8/00 (2006.01)

(52) U.S. Cl. .......... 365/230.06; 365/189.05; 365/189.11

(58) Field of Classification Search ............. 365/230.06, 365/149, 189.11, 189.05
See application file for complete search history.

(56) References Cited

U.S. PATENT DOCUMENTS

| | | | |
|---|---|---|---|
| 5,202,855 A | 4/1993 | Morton | |
| 5,297,104 A | 3/1994 | Nakashima | |
| 5,412,331 A | 5/1995 | Jun et al. | |
| 5,557,580 A | 9/1996 | Numaga et al. | |
| 5,617,369 A | 4/1997 | Tomishima et al. | |
| 5,663,911 A | 9/1997 | Kaneko | |
| 5,872,737 A | 2/1999 | Tsuruda et al. | |
| 5,949,735 A | 9/1999 | Jeong | |
| 6,046,956 A | 4/2000 | Yabe | |
| 6,147,914 A | 11/2000 | Leung et al. | |
| 6,469,952 B1 | 10/2002 | Tsukikawa | |
| 6,545,923 B2 | 4/2003 | Sim et al. | |
| 2005/0105322 A1* | 5/2005 | Kobayashi et al. | ............ 365/149 |
| 2005/0105372 A1* | 5/2005 | Kanda | ....................... 365/230.06 |
| 2008/0279017 A1* | 11/2008 | Shimano et al. | ......... 365/189.06 |
| 2008/0291717 A1 | 11/2008 | Origasa | |

FOREIGN PATENT DOCUMENTS

| | | |
|---|---|---|
| JP | 05-012865 | 1/1993 |
| JP | 5-89673 | 4/1993 |
| JP | 6-203556 A | 7/1994 |
| JP | 6-215567 | 8/1994 |
| JP | 7-57467 | 3/1995 |
| JP | 7-114793 A | 5/1995 |
| JP | 7-307091 | 11/1995 |
| JP | 08-063964 | 3/1996 |
| JP | 8-167288 | 6/1996 |
| JP | 9-106677 | 4/1997 |
| JP | 10-135424 | 5/1998 |
| JP | 10-144081 | 5/1998 |
| JP | 10-241361 | 9/1998 |
| JP | 11-031384 | 2/1999 |

(Continued)

*Primary Examiner* — Toan Le

(74) *Attorney, Agent, or Firm* — McDermott Will & Emery LLP

(57) ABSTRACT

In order to latch and store a word line reset level voltage (negative voltage) which is set during reset operation, a word line driver includes PMOS transistors and NMOS transistors. The word line driver further includes a stress-reducing PMOS transistor and an NMOS transistor, and also a word line bias control circuit which controls and activates a supply bias during setting of a word line, start of resetting, and a reset period.

18 Claims, 8 Drawing Sheets

FOREIGN PATENT DOCUMENTS

| | | |
|---|---|---|
| JP | 11-283369 | 10/1999 |
| JP | 2001-126479 | 5/2001 |
| JP | 2001-202778 | 7/2001 |
| JP | 2001-297583 | 10/2001 |
| JP | 2002-522871 | 7/2002 |
| JP | 2002-352580 | 12/2002 |
| JP | 2008-287826 A | 11/2008 |

* cited by examiner

US 8,345,506 B2

SEMICONDUCTOR MEMORY DEVICE

CROSS-REFERENCE TO RELATED APPLICATIONS

This is a continuation of PCT International Application PCT/JP2009/000756 filed on Feb. 23, 2009, which claims priority to Japanese Patent Application No. 2008-300972 filed on Nov. 26, 2008. The disclosures of these applications including the specifications, the drawings, and the claims are hereby incorporated by reference in their entirety.

BACKGROUND

The present disclosure relates to semiconductor memory devices, and more particularly, to semiconductor memory devices having negative boost word line drivers for causing the levels of word lines to have a negative voltage when the device is reset.

In recent years, for embedded dynamic random access memory (DRAM), there has been particularly a demand for higher integration which allows system-on-chip (SOC) with low cost. The area of a memory device is dominated by a memory array. Therefore, in order to achieve higher integration, attempts have been made to reduce the area of each memory cell by applying microfabrication techniques to memory cell transistors, or memory cell capacitors using high-k insulating film.

In DRAM, in order to fully restore a voltage having a bit line amplitude in a memory cell capacitor, a transistor having a thick film is used as the memory cell transistor because a voltage higher than the threshold voltage (Vth) needs to be applied to the gate. At the same time, the memory cell transistor needs to have a low leakage characteristic in order to hold data of the memory cell capacitor. Therefore, the threshold voltage of the memory cell transistor is set to a high value, and the back bias effect is large, and therefore, the set level of word lines is a voltage which is higher, by 1 V or more, than the high voltage of bit lines.

On the other hand, the gate length of the memory cell transistor needs to be decreased in order to reduce the size of the memory cell transistor. Also, the thickness of the memory cell transistor needs to be decreased in order to reduce a leakage current which is caused by the short channel effect. In this case, a voltage at the word line set level needs to be decreased in terms of reliability, and at the same time, the threshold voltage Vth needs to be decreased in order to ensure the restoration level of the memory cell capacitor, and the leakage current needs to be prevented from increasing.

To solve the above problems, an architecture called a negative boost word line scheme is known. In this technique, satisfactory characteristics required for the memory cell transistor may be obtained by modifying the reset level of word lines from a ground voltage to a negative boost voltage level.

When the negative boost word line scheme is introduced, a word line driver which can shift the level of a signal having a bit line voltage amplitude in both the positive direction and the negative direction is additionally required. As examples of such a negative boost word line driver, various level shift circuits are proposed in Japanese Patent Publication No. H07-307091.

Japanese Patent Publication No. H08-63964 describes a configuration in which an address decoding function is provided, and a level shift voltage in both the positive direction and the negative direction can be applied to a word line using a small number of elements. An example of this conventional word line driver is shown in FIG. 7. In FIG. 7, reference characters 100a and 100b indicate word line drivers, reference characters XA, XB, WD<0>, and WD<1> indicate word line select address signals, a reference character /STWD indicates a word line reset control signal, reference characters WL<0> and WL<1> indicate word lines, a reference character BL indicates a bit line, reference characters /AD and Node1 indicate internal nodes, a reference character Vdd indicates the high voltage of the bit line, a reference character Vss indicates the low voltage of the bit line, a reference character Vpp indicates the set level voltage of the word lines, a reference character Vw indicates the reset level voltage of the word lines, a reference character Vcp indicates the plate voltage of a memory cell, reference characters QN1, QN2, QAN1, and QAN2 indicate NMOS transistors, reference characters QP1-QP3, QAP1, and QAP2 indicate PMOS transistors, a reference character QC indicates a memory cell transistor, and a reference character C indicates a memory cell capacitor.

Operation of the word line driver 100a thus configured will be described with reference to a timing diagram shown in FIG. 8. Initially, in a reset state before timing t10, the word line reset control signal /STWD is low, so that the level of the internal node Node1 is Vpp, and the word line WL<0> is at the reset level Vw. The word line WL<1> driven by the adjacent word line driver 100b is similarly held at the reset level Vw (not shown). Thereafter, at timing t10, a portion of an address input to the word line driver 100a is selected (logic high), and the internal node /AD goes low. At timing t11, WD<0> which is a superimposition of a word line activate signal and an address signal goes high, and at the same time, the word line reset control signal /STWD goes high, so that the level of the internal node Node1 goes low, and the word line WL<0> goes to the set level Vpp. Because WD<1> is low (non-selected state), the adjacent word line driver 100b remains in the reset state although the internal node /AD connected commonly to the word line drivers 100a and 100b is low. Thereafter, at timing t12, WD<0> goes low, and the word line reset control signal /STWD goes low, so that the internal node Node1 goes high, and the voltage of the word line WL<0> returns to the reset level Vw. Thereafter, at timing t13, the word line select address signals XA and XB and the internal node /AD return to their original states. Here, t10 and t11, or t12 and t13, may be the same timing.

In the above configuration, |Vw| is applied between the gate and source of the NMOS transistor QN1 when the word line WL<0> is selected, and therefore, a leakage current is likely to flow from the power supply Vpp to the power supply Vw. Therefore, the threshold voltage of the NMOS transistor QN1 is set to be higher than those of transistors around the transistor QN1. In the case of embedded DRAM, the transistor QN1 is typically formed using the same gate oxide film of a high-voltage transistor of a logic circuit or the memory cell transistor QC, whereby the number of processes is decreased to reduce the cost. However, in the case of the configuration including the negative boost word line driver, for example, when the memory device is reset, the source-to-drain voltage of the PMOS transistor QP1, the gate-to-source voltage of the NMOS transistor QN1, and the gate-to-source voltage of the PMOS transistor QP2 are all Vpp+|Vw| (> Vpp), and therefore, the reliability is likely to be degraded due to voltage stress.

To solve this problem, there is, for example, a known technique of reducing the voltage stress by inserting a diode transistor, as described in, for example, Japanese Patent Publication Nos. 2001-297583 and H11-283369.

Moreover, the negative boost word line driver may suffer from an increase in power consumption and current noise of the negative boost power supply. Because the negative boost voltage is generated using a charge pump having low power supply efficiency, power consumption is likely to increase if a discharged current from a word line increases. In addition, it takes a long time to cause a changed voltage level to return to the set level. As a result, the word line reset level changes, so that the leakage current of the memory cell transistor increases, and therefore, the charge holding characteristic is degraded.

To solve this problem, there is, for example, a known technique of, when a word line is reset, temporarily discharging the word line to a ground voltage, and thereafter, discharging the word line to the negative boost power supply, thereby reducing the discharged current to the negative boost power supply to reduce power consumption and improve voltage stability, as described in, for example, Japanese Patent Publication Nos. H10-241361 and 2002-352580.

SUMMARY

However, there is a strong demand for a reduction in cost which is achieved by a reduction in area. Therefore, a negative boost word line driver including a smaller number of parts than that of Japanese Patent Publication No. H08-63964 is preferable. Moreover, if such a negative boost word line driver is provided with a configuration for reducing the voltage stress, such as those described in Japanese Patent Publication Nos. 2001-297583 and H11-283369, high-speed word line drive is also required. Moreover, if the configuration of Japanese Patent Publication No. H10-241361 or 2002-352580 is used to reduce the power consumption and noise of the negative boost power supply, an additional NMOS transistor is required for each word line driver, resulting in considerable area penalties.

The present disclosure describes implementations of a negative boost word line driver with a smaller area, higher speed, higher accuracy, and lower power consumption.

An example semiconductor memory device of the present disclosure includes word line drivers configured to be selected based on a plurality of word line select address signals. Each of the word line drivers has a set level which is a first voltage, and a reset level which is a second voltage. A latch is formed in each of the word line drivers only when a corresponding word line is not selected, and the latch is used to hold the voltage of the word line at the reset level. As a result, the number of parts constituting the word line drivers the number of which is the same as the number of the word lines can be reduced, whereby the word line driver has a smaller area.

The present disclosure provides a negative boost word line driver with a smaller area, higher speed, higher accuracy, and lower power consumption.

DETAILED DESCRIPTION

<<First Embodiment>>

A first embodiment of the present disclosure will be described hereinafter with reference to the accompanying drawings.

Figure 1:
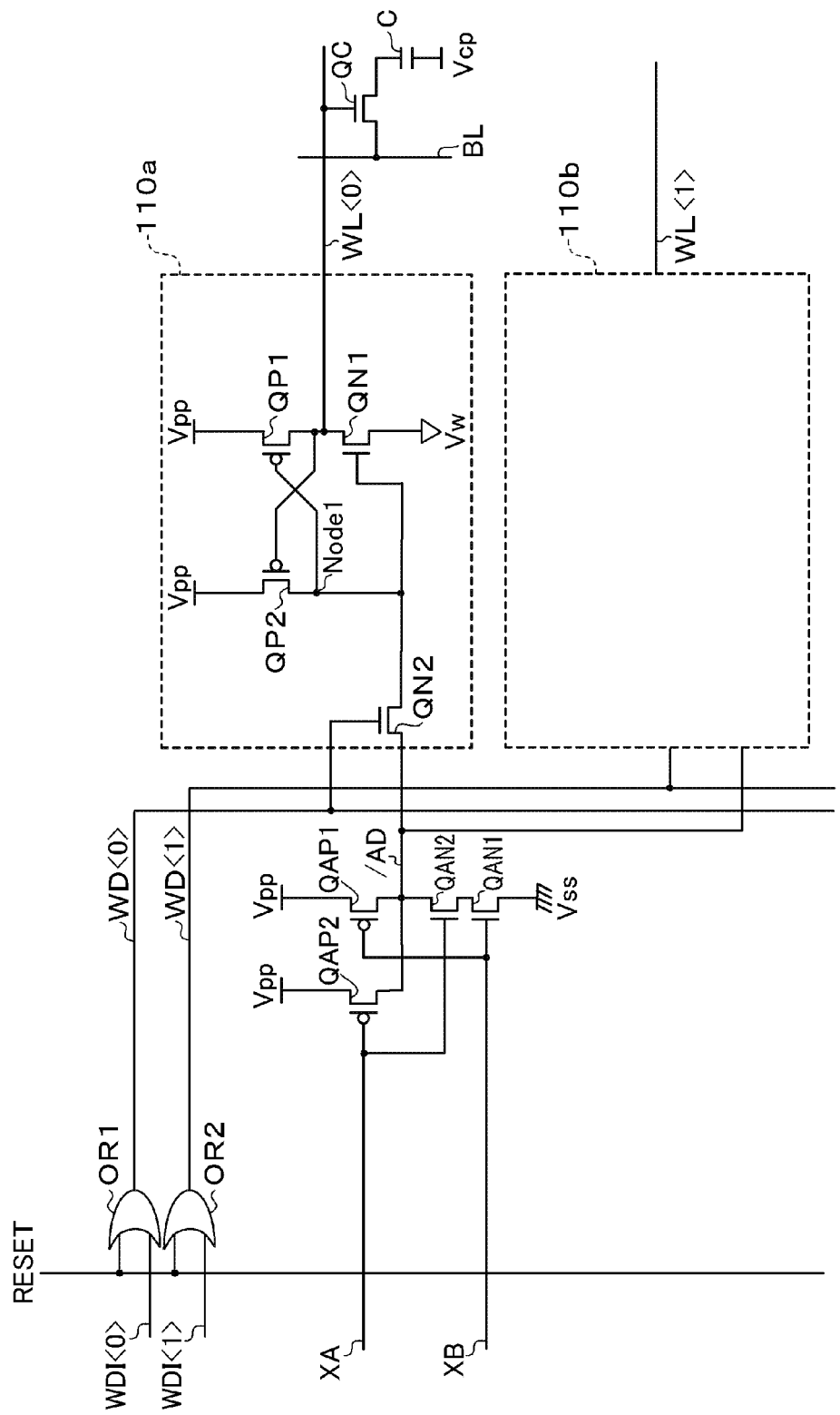
FIG. 1 is a circuit diagram of word line drivers in a semiconductor memory device according to a first embodiment of the present disclosure.
Figure 7:
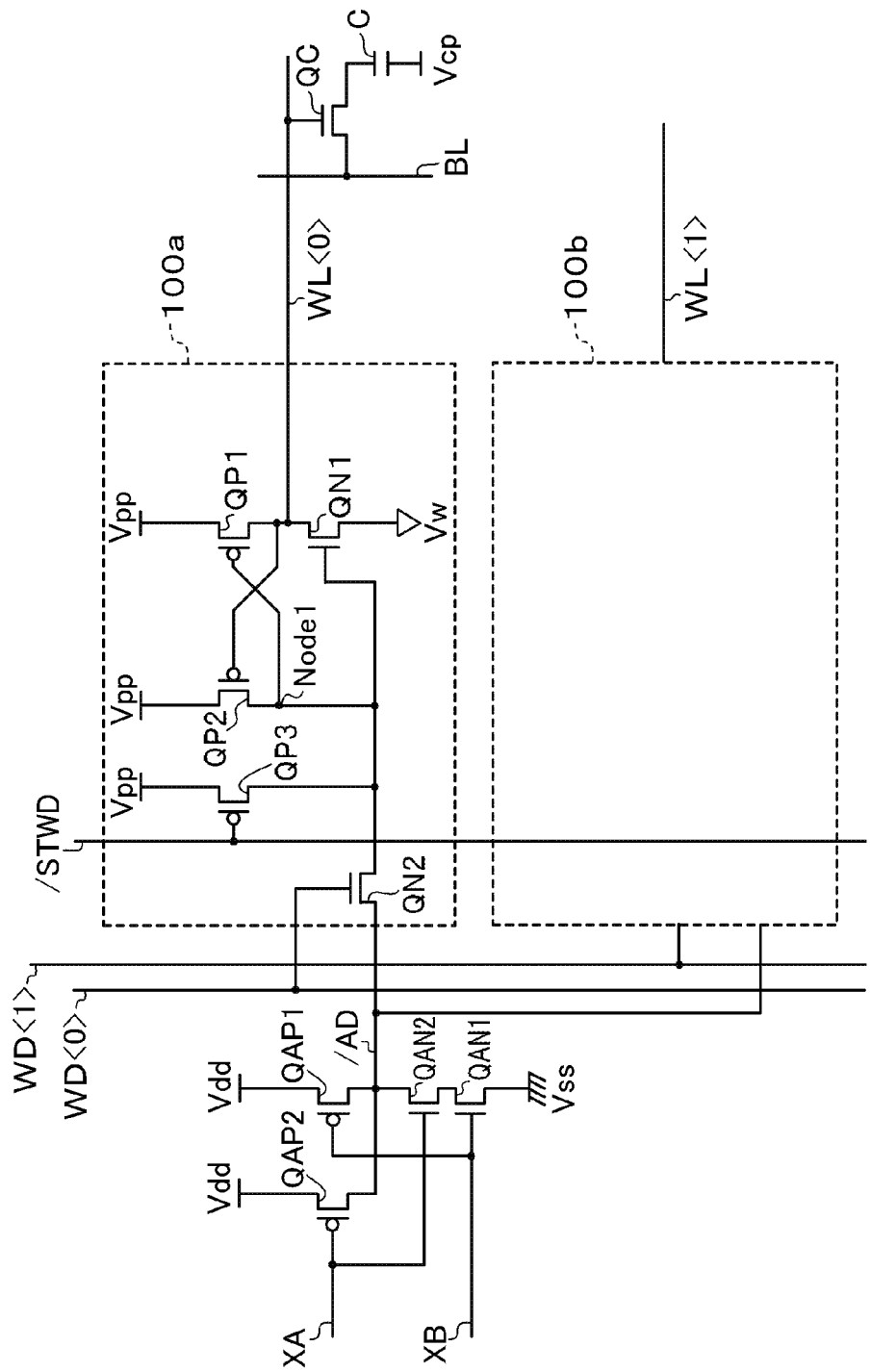
FIG. 7 is a circuit diagram of word line drivers in a conventional semiconductor memory device.

FIG. 1 is a circuit diagram of word line drivers in a semiconductor memory device according to the first embodiment of the present disclosure. Reference characters 110a and 110b indicate word line drivers, reference characters XA, XB, WDI<0>, WDI<1>, WD<0>, and WD<1> indicate word line select address signals, reference characters WL<0> and WL<1> indicate word lines, a reference character BL indicates a bit line, reference characters /AD and Node1 indicate internal nodes, a reference character RESET indicates a power supply activation flag signal, a reference character Vss indicates a bit line low voltage (ground voltage), a reference character Vpp indicates a word line set level voltage (positive boosted voltage), a reference character Vw indicates a word line reset level voltage (negative voltage), a reference character Vcp indicates a memory cell plate voltage, reference characters QN1, QN2, QAN1, and QAN2 indicate NMOS transistors, reference characters QP1, QP2, QAP1, and QAP2 indicate PMOS transistors, a reference character QC indicates a memory cell transistor, a reference character C indicates a memory cell capacitor, and reference characters OR1 and OR2 indicate OR circuits. The semiconductor memory device of FIG. 1 is different from the conventional example of FIG. 7 in the following points: the word line reset control signal /STWD and the PMOS transistor QP3 are removed; the word line select address signals WD<0> and WD<1> are selected in synchronization with the power supply activation flag signal RESET by the added OR circuits OR1 and OR2; the high voltages of the word line select address signals XA, XB, WDI<0>, WDI<1>, WD<0>, and WD<1> are boosted from the bit line high level Vdd to the word line set level Vpp before being supplied; and the word line set level voltage Vpp is also applied to a NAND circuit which is composed of the NMOS transistors QAN1 and QAN2 and the PMOS transistors QAP1 and QAP2.

More specifically, in the word line driver 110a, the source, gate, and drain of the PMOS transistor QP1 are connected to the word line set level voltage Vpp, the internal node Node1, and the word line WL<0>, respectively. The drain, gate, and source of the NMOS transistor QN1 are connected to the word line WL<0>, the internal node Node1, and the word line reset level voltage Vw, respectively. The source, gate, and drain of the PMOS transistor QP2 are connected to the word line set level voltage Vpp, the word line WL<0>, and the internal node Node1, respectively. The gate, source, and drain of the NMOS transistor QN2 are connected to the word line select address signal WD<0>, the internal node /AD, and the internal node Node1, respectively. In the word line driver 110a, only when the word line WL<0> is not selected, the PMOS transistor QP1 in the off state, the NMOS transistor QN1 in the on state, and the PMOS transistor QP2 in the on state form a latch which holds the voltage of the word line WL<0> at the reset level Vw.

Figure 2:
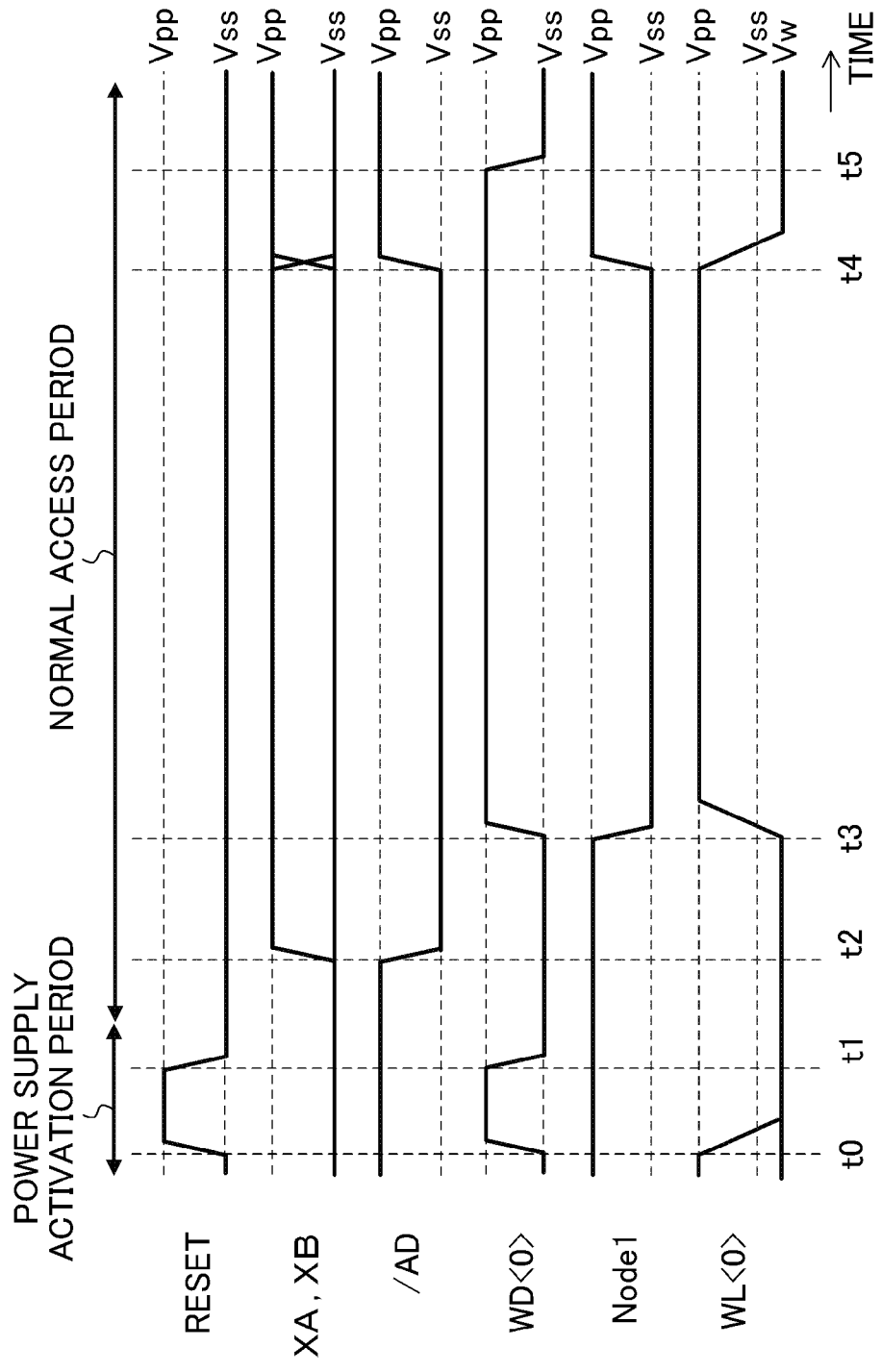
FIG. 2 is a timing diagram of the word line drivers in the semiconductor memory device of FIG. 1.
Figure 8:
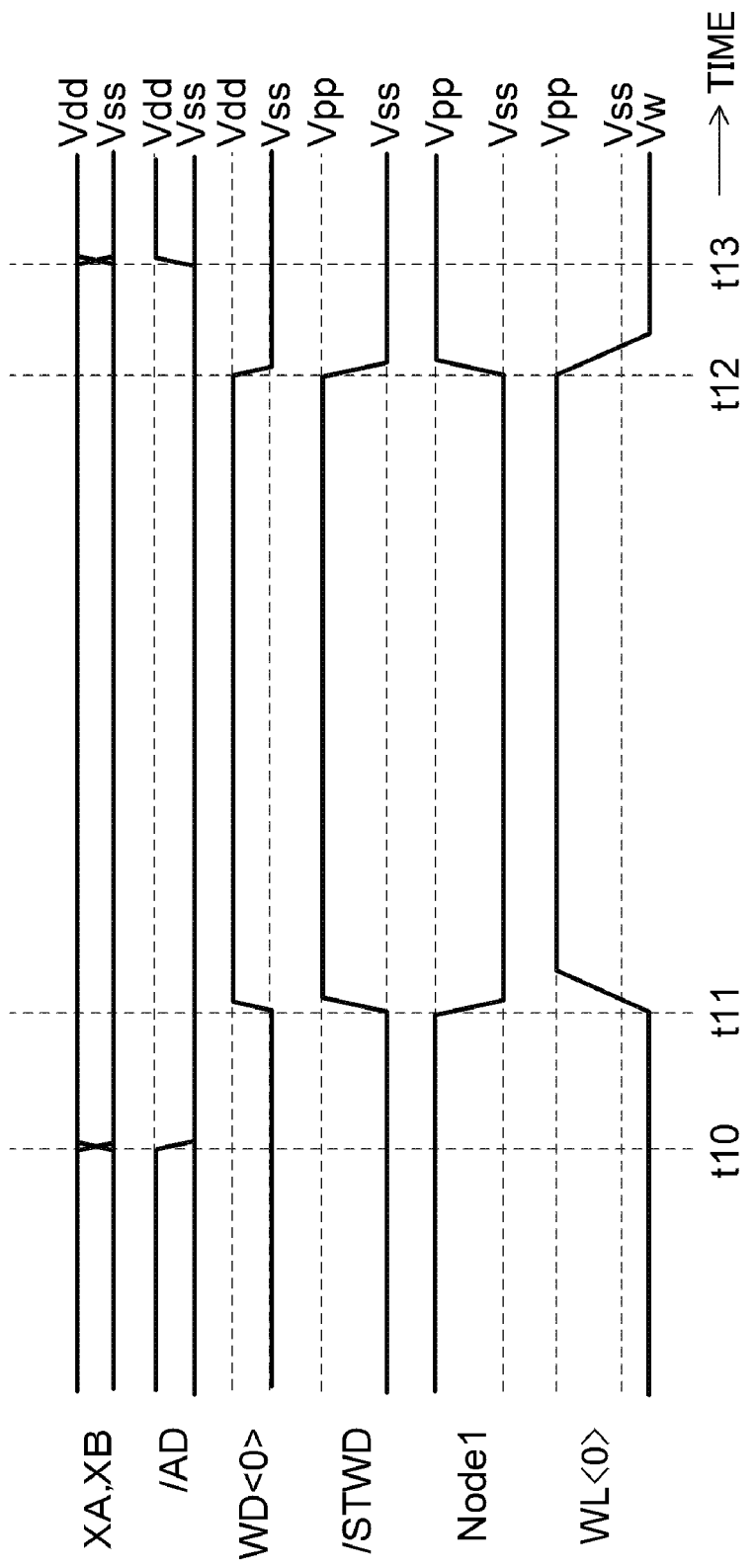
FIG. 8 is a timing diagram of the word line drivers in the semiconductor memory device of FIG. 7.

Operation of the circuit thus configured will be described with reference to a timing diagram shown in FIG. 2. The timing diagram of FIG. 2 is different from the timing diagram of the word line driver in the conventional semiconductor memory device of FIG. 8 in the following points: during a power supply activation period or a predetermined period of time after activation of the power supply, i.e., between timings t0 and t1, the power supply activation flag signal RESET is enabled, and in response to this, the word line select address signals XA and XB go logic low (non-selected state), and the word line select address signals WD<0> and WD<1> go logic high (selected state), whereby all the word lines WL<0> and WL<1> temporarily go to the reset level Vw; and at word line reset timing t4, word line reset timing information is superimposed on one or both of the word line select address signals XA and XB, and the internal nodes /AD and Node1 go high, whereby the word line WL<0> is discharged to the reset level Vw, and at delayed timing t5, the word line select address signal WD<0> goes low. Note that timings t2 and t3 of FIG. 2 correspond to timings t10 and t11 of FIG. 8, respectively.

According to this embodiment, the word line the reset level Vw which is set during reset operation is latched and stored, whereby the word line reset control signal /STWD and the PMOS transistor QP3 which are required in the conventional configuration are removed, so that it is possible to reduce the number of parts constituting the word line drivers 110a and 110b the number of which is the same as the number of the word lines, and therefore, the area can be reduced.

Also, according to this embodiment, WD<0> and WD<1> which are a portion of the plurality of word line select address signals go to the logic (high) which resets all the word lines during a predetermined period of time that the power supply is activated. Therefore, the initial outputs of all the word line drivers during the power supply activation period can be reliably caused to be in the reset state, which is then held by a latch included in each of the word line drivers 110a and 110b. As a result, it is possible to reduce or prevent erroneous operation that the word line drivers 110a and 110b are initially multiply selected.

Also, according to this embodiment, the NMOS transistor QN2 has an address decoding function, and therefore, it is not necessary to provide NAND circuits for decoding an address in one-to-one correspondence with the word line drivers 110a and 110b, whereby the area can be reduced.

Note that only when the word line is set, the gate-to-source voltage of the NMOS transistor QN1 is |Vw|, and therefore, a leakage current flows from the power supply Vpp to the power supply Vw. To reduce or prevent this, the threshold voltage of the NMOS transistor QN1 may be set to be higher than the threshold voltages of the other transistors QP1, QP2, and QN2, or another NMOS transistor may be connected in series between the NMOS transistor QN1 and the power supply Vw to provide the back bias effect.

<<Second Embodiment<<

Figure 3:
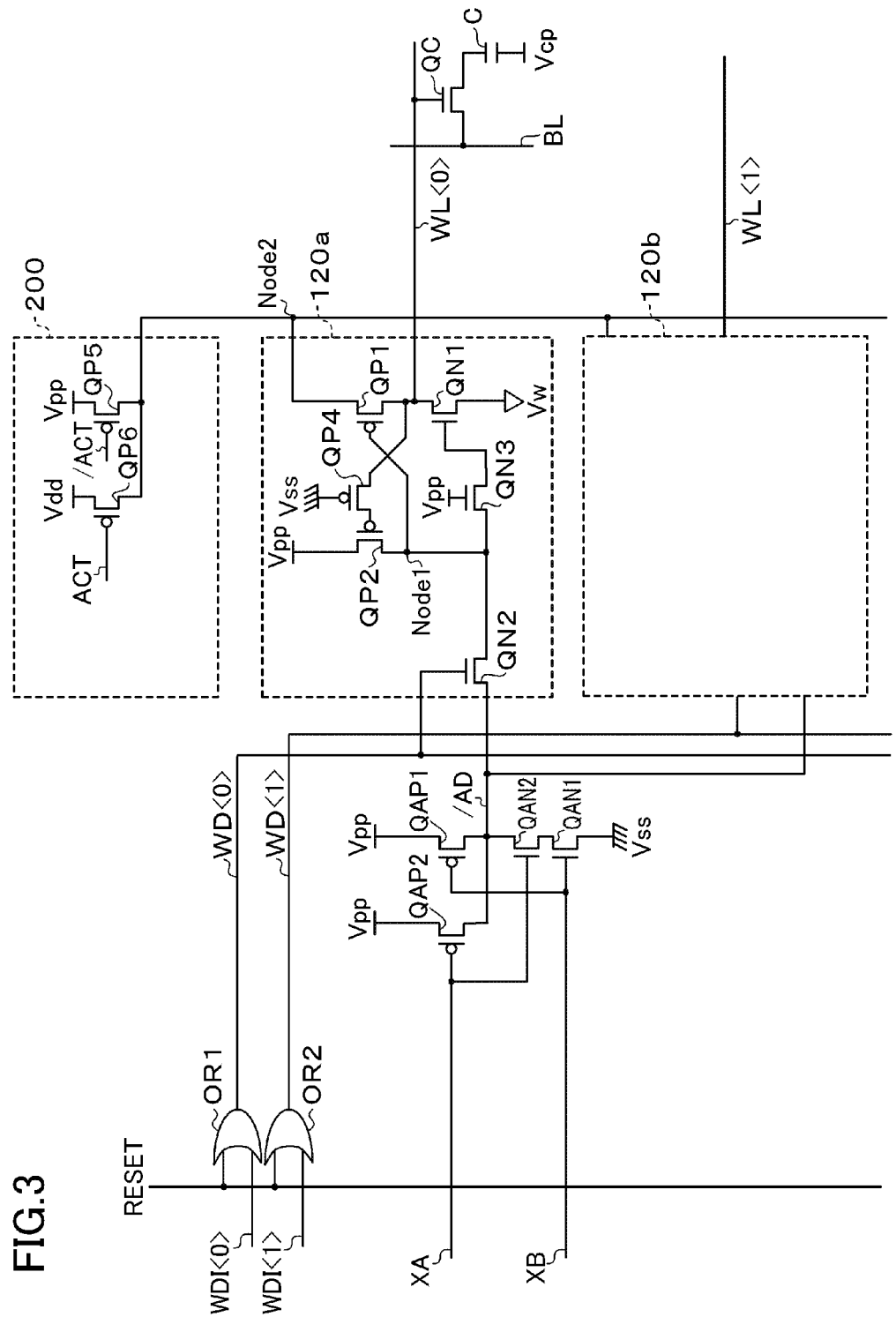
FIG. 3 is a circuit diagram of word line drivers in a semiconductor memory device according to a second embodiment of the present disclosure.

FIG. 3 is a circuit diagram of word line drivers in a semiconductor memory device according to a second embodiment of the present disclosure. The word line drivers of FIG. 3 are different from the word line drivers in the semiconductor memory device of the first embodiment of the present disclosure of FIG. 1 in the following points: a PMOS transistor QP4 and an NMOS transistor QN3 for reducing stress are added in the word line drivers 120a and 120b; and a word line bias control circuit 200 including PMOS transistors QP5 and QP6 is added. Reference characters ACT and /ACT indicate word line bias control signals, and a reference character Node2 indicates an internal node.

More specifically, in the word line driver 120a, the source, gate, and drain of the PMOS transistor QP1 are connected to the internal node Node2, the internal node Node1, and the word line WL<0>. The drain of the NMOS transistor QN1 is connected to the word line WL<0>, the gate of the NMOS transistor QN1 is connected via the stress-reducing NMOS transistor QN3 to the internal node Node1, and the source of the NMOS transistor QN1 is connected to the word line reset level voltage Vw. The gate of the stress-reducing NMOS transistor QN3 is connected to the word line set level voltage Vpp. The source of the PMOS transistor QP2 is connected to the word line set level voltage Vpp, the gate of the PMOS transistor QP2 is connected via the stress-reducing PMOS transistor QP4 to the word line WL<0>, and the drain of the PMOS transistor QP2 is connected to the internal node Node1.

The gate of the stress-reducing PMOS transistor QP4 is connected to the ground voltage Vss. The gate, source, and drain of the NMOS transistor QN2 are connected to the word line select address signal WD<0>, the internal node /AD, and the internal node Node1, respectively.

On the other hand, in the word line bias control circuit 200, the source, gate, and drain of the PMOS transistor QP5 are connected to the word line set level voltage Vpp, the word line bias control signal /ACT, and the internal node Node2, respectively. The source, gate, and drain of the PMOS transistor QP6 are connected to the bit line high voltage Vdd, the word line bias control signal ACT, and the internal node Node2, respectively.

Figure 4:
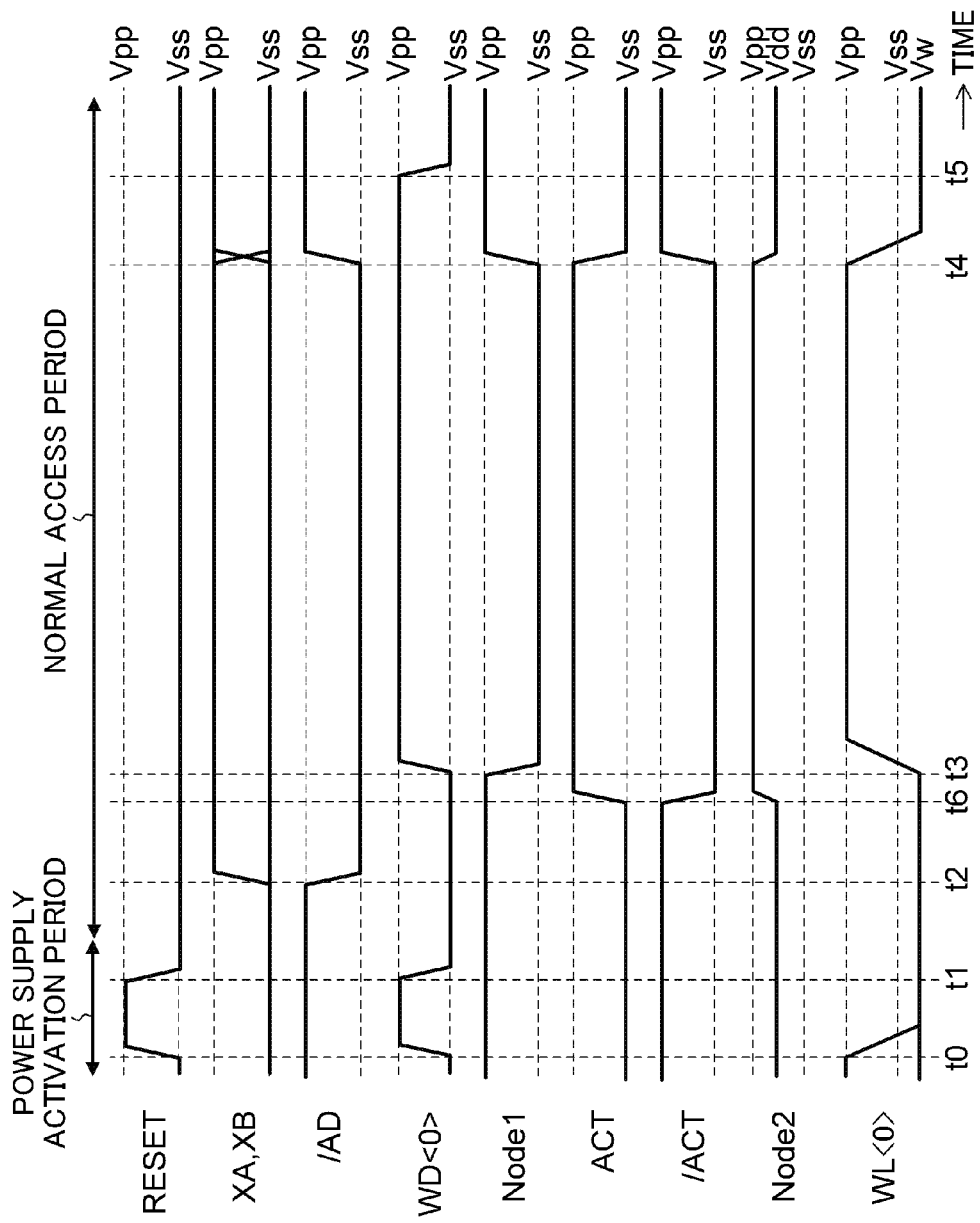
FIG. 4 is a timing diagram of the word line drivers in the semiconductor memory device of FIG. 3.

Operation of the circuit thus configured will be described with reference to a timing diagram shown in FIG. 4. The timing diagram of FIG. 4 is different from the timing diagram of the word line driver in the semiconductor memory device of the first embodiment of the present disclosure of FIG. 2 in that at timing t6, the word line bias control signal ACT goes high and the inverted signal /ACT goes low, so that the internal node Node2 is controlled to the word line set level voltage Vpp, and thereafter, at timing t4, the word line bias control signal ACT goes low and the inverted signal /ACT goes high, so that the internal node Node2 is controlled to the bit line high voltage Vdd.

According to this embodiment, the NMOS transistor QN3 can reduce the gate-to-source voltage of the NMOS transistor QN1 in the word line reset state from Vpp+|Vw| to Vpp−Vth_n3+|Vw|, where Vth_n3 is the threshold voltage of the NMOS transistor QN3. Similarly, the PMOS transistor QP4 can reduce the gate-to-source voltage of the PMOS transistor QP2 in the word line reset state to Vpp−Vth_p4+|Vw|, where Vth_p4 is the threshold voltage of the PMOS transistor QP4. As a result, the reliability of the NMOS transistor QN1 and the PMOS transistor QP2 can be improved.

Also, according to this embodiment, the sources of the PMOS transistors QP1 in the word line drivers 120a and 120b are connected commonly to the internal node Node2, and the word line bias control circuit 200 is provided which switches a voltage supplied to the internal node Node2 between Vdd and Vpp. As a result, the source-to-drain voltage of the PMOS transistor QP1 in the word line reset state can be reduced from the conventional Vpp+|Vw| to Vdd+|Vw|, whereby the reliability can be improved. Moreover, by reducing the source-to-drain voltage of the PMOS transistor QP1, a leakage current flowing into the power supply Vw can be reduced, and therefore, a highly stable retention characteristic and a reduction in power consumption can be simultaneously achieved.

Because the internal node Node2 is shared by the word line drivers 120a and 120b, the load capacitance of the internal node Node2 is large. However, because the internal node Node2 in the word line reset state is at the bit line high voltage Vdd, the load capacitance of the internal node Node2 can be quickly charged to the word line set level voltage Vpp by the word line driver set timing t3, resulting in high-speed word line set operation.

The word line bias control circuit 200 is shared by the word line drivers 120a and 120b, and therefore, area penalties are substantially negligible.

Note that the present disclosure is not limited to the above embodiment. Alternatively, for example, the internal node Node2 in the word line reset state may be at an intermediate voltage between the word line set level voltage Vpp and the ground voltage Vss, e.g., a voltage which is lower by the transistor threshold voltage than the word line set level voltage Vpp, etc.

<<Third Embodiment>>

Figure 5:
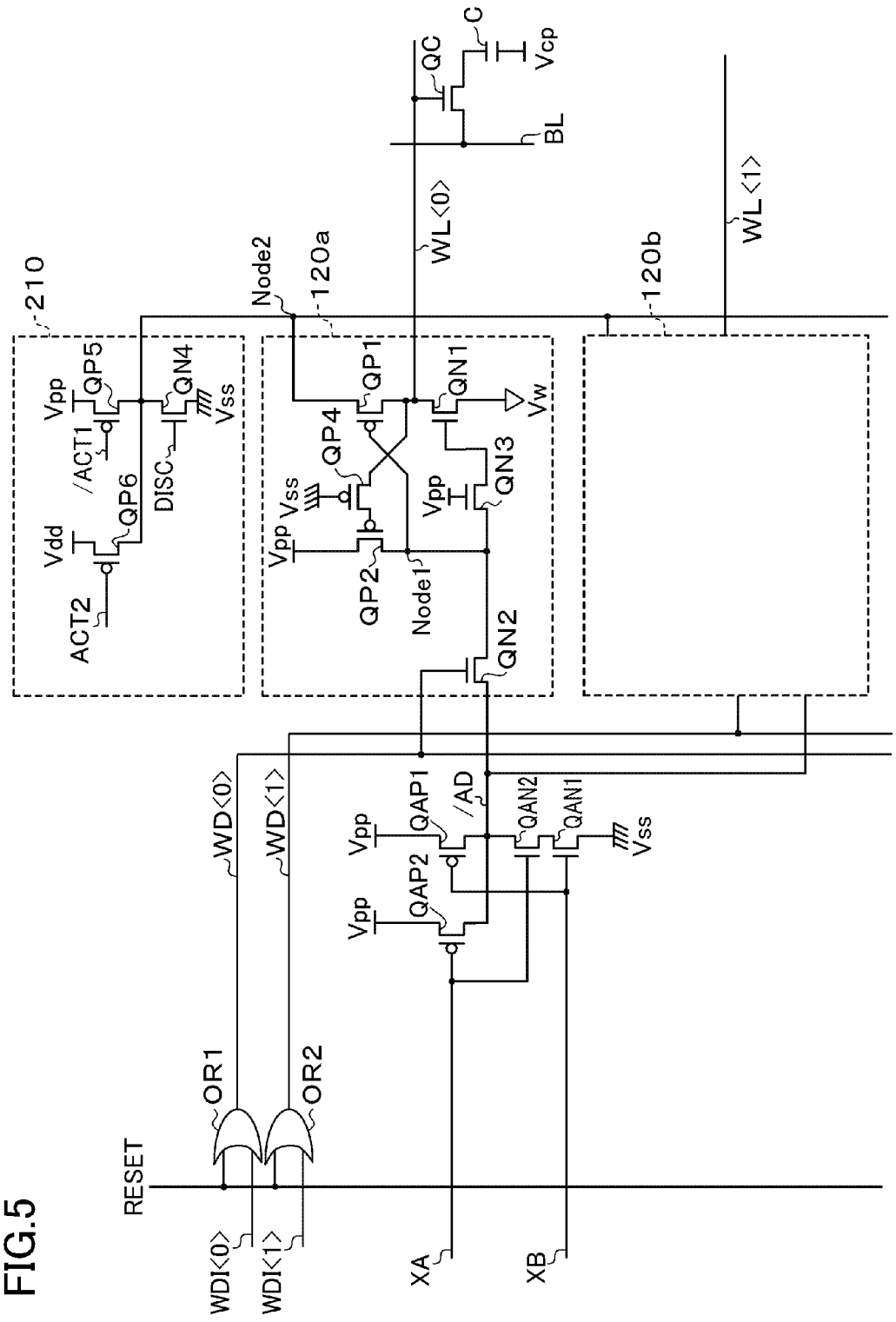
FIG. 5 is a circuit diagram of word line drivers in a semiconductor memory device according to a third embodiment of the present disclosure.

FIG. 5 is a circuit diagram of word line drivers in a semiconductor memory device according to a third embodiment of the present disclosure. The circuit diagram of FIG. 5 is different from the circuit diagram of the word line driver in the semiconductor memory device of the second embodiment of the present disclosure of FIG. 3 in that an NMOS transistor QN4 is added to a word line bias control circuit 210. Reference characters /ACT1, ACT2, and DISC indicate word line bias control signals.

More specifically, in the word line bias control circuit 210, the source, gate, and drain of the PMOS transistor QP5 are connected to the word line set level voltage Vpp, the word line bias control signal /ACT1, and the internal node Node2, respectively. The source, gate, and drain of the PMOS transistor QP6 are connected to the bit line high voltage Vdd, the word line bias control signal ACT2, and the internal node Node2, respectively. The drain, gate, and source of the NMOS transistor QN4 are connected to the internal node Node2, the word line bias control signal DISC, and the ground voltage Vss, respectively.

Figure 6:
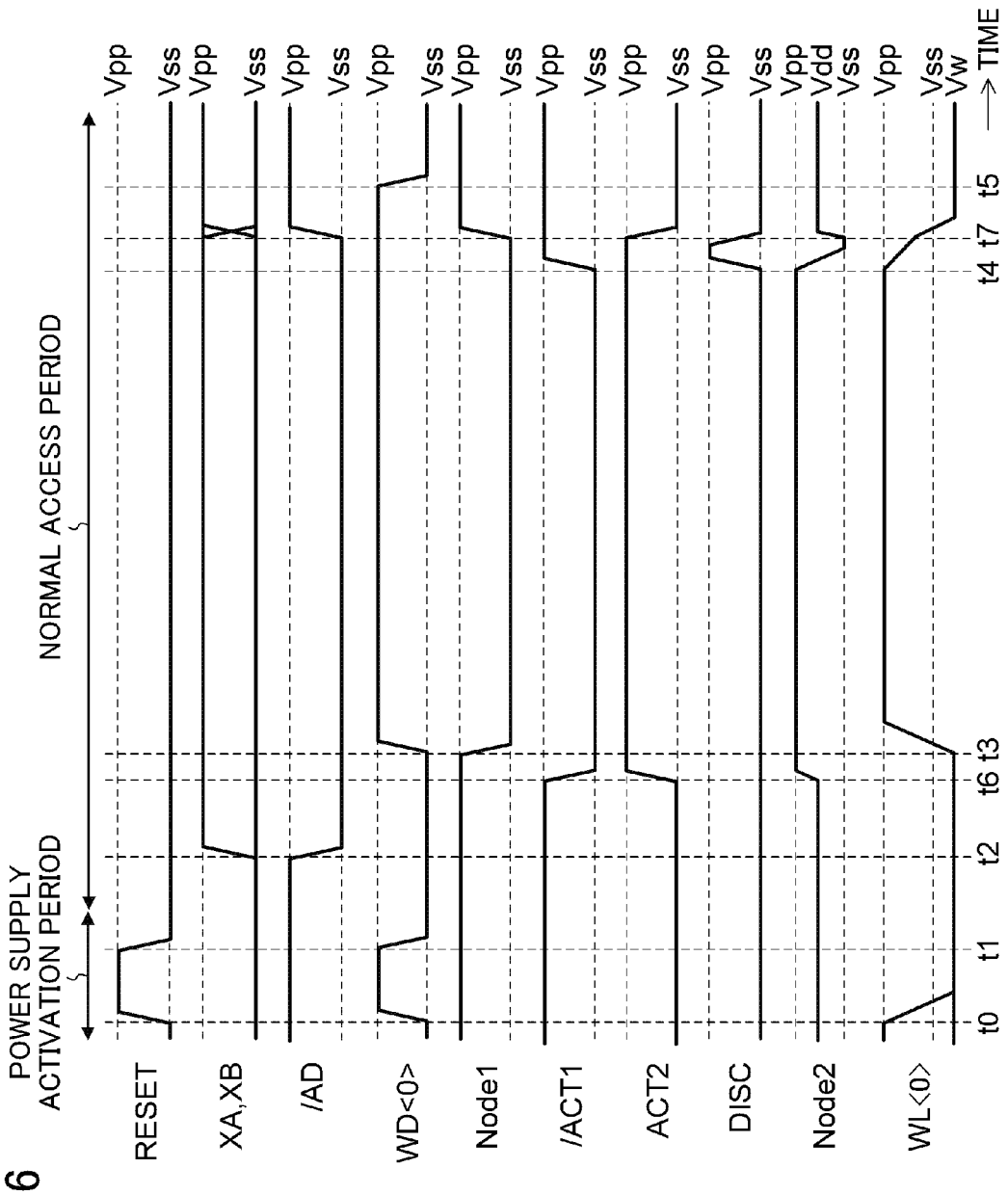
FIG. 6 is a timing diagram of the word line drivers in the semiconductor memory device of FIG. 5.

Operation of the circuit thus configured will be described with reference to a timing diagram shown in FIG. 6. The timing diagram of FIG. 6 is different from the timing diagram of the word line driver in the semiconductor memory device of the second embodiment of the present disclosure of FIG. 4 in that, at timing t4, the word line bias control signals /ACT1 and DISC go high, so that the PMOS transistor QP1 is turned on and the level of the internal node Node2 goes to the ground voltage Vss, and at timing t7, the internal nodes /AD and Node1 go high, so that the PMOS transistor QP1 is turned off, and the word line bias control signal ACT2 goes low, so that the internal node Node2 is charged to the bit line high voltage Vdd.

According to this embodiment, not only the transistor reliability can be improved as in the second embodiment of the present disclosure, but also when the word lines are reset, a portion of the charge on the word line WL<0> is discharged to the power supply Vss via the PMOS transistor QP1 and the NMOS transistor QN4, and thereafter, the remaining charge on the word line WL<0> is discharged to the power supply Vw (negative boost power supply), whereby current noise to the power supply Vw can be reduced. The reduction in the current noise can improve the charge holding characteristic of memory cells, and can also reduce power consumption in the negative boost voltage generation circuit which employs a charge pump, which has low efficiency, and therefore, power consumption in the memory chip can also be reduced.

In addition, the NMOS transistor QN4 for discharging the word lines is shared by the word line drivers 120a and 120b, whereby the area can be reduced without increasing the number of parts in the word line drivers 120a and 120b the number of which is the same as the number of the word lines.

Note that when charge on the word lines is discharged to the power supply Vss, the word line voltage cannot be set to be lower than the absolute value of the threshold voltage of the PMOS transistor QP1. However, if the substrate and the source (i.e., the internal node Node2) of the PMOS transistor QP1 are connected together, the substrate bias effect can be reduced, and therefore, the word line voltage can be reduced to a lower voltage, whereby the current noise to the power supply Vw can be further reduced.

The first to third embodiments are only for illustrative purposes, and the present disclosure is not limited to the first to third embodiments. Various changes and modifications can be made without departing the spirit and scope of the present disclosure.

The semiconductor memory device including the negative boost word line drivers of the present disclosure is useful as a semiconductor memory device with a smaller area, higher reliability, and lower power consumption.

What is claimed is:

1. A semiconductor memory device comprising:
   word line drivers configured to be selected based on a plurality of word line select address signals,
   wherein
   each of the word line drivers has a set level which is a first voltage, and a reset level which is a second voltage, and a latch is formed in each of the word line drivers only when a corresponding word line is not selected, and the latch is used to hold the voltage of the word line at the reset level.

2. The semiconductor memory device of claim 1, wherein the second voltage is lower than a ground voltage.

3. The semiconductor memory device of claim 1, wherein the first voltage is higher than a third voltage which is a maximum voltage of a bit line.

4. The semiconductor memory device of claim 1, wherein a portion of the plurality of word line select address signals is connected to a logic which resets all the word lines during a predetermined period of time that a power supply is activated.

5. The semiconductor memory device of claim 1, wherein the word line drivers each include a transistor configured to pull down the corresponding word line to the second voltage, and
   the threshold voltage of the pull-down transistor is higher than the threshold voltages of the other transistors included in the word line driver.

6. The semiconductor memory device of claim 1, wherein the word line drivers each include a transistor configured to pull down the corresponding word line to the second voltage, and
   the pull-down transistor includes a plurality of transistors connected in series.

7. The semiconductor memory device of claim 1, wherein the word line drivers each include a first and a second PMOS transistor and a first NMOS transistor,
   the drain of the first PMOS transistor, the drain of the first NMOS transistor, and the gate of the second PMOS transistor are connected to the corresponding word line,
   the gate of the first PMOS transistor, the gate of the first NMOS transistor, and the drain of the second PMOS transistor are commonly connected, and
   the source of the first PMOS transistor is connected to a voltage supply for the set level of the corresponding word line, the source of the second PMOS transistor is connected to the first voltage, and the source of the first NMOS transistor is connected to the second voltage.

8. The semiconductor memory device of claim 7, wherein the word line drivers each further include a second NMOS transistor, a first signal is supplied to the gate of the second NMOS transistor, and a second signal is supplied to the source of the second NMOS transistor, and the drain of the second NMOS transistor is connected to the drain of the second PMOS transistor.

9. The semiconductor memory device of claim 7, wherein the word line drivers each further include a third PMOS transistor and a third NMOS transistor, the third PMOS transistor is connected between the drain of the first PMOS transistor and the gate of the second PMOS transistor, the third NMOS transistor is connected between the gate of the first NMOS transistor and the drain of the second PMOS transistor, and the gate of the third PMOS transistor is connected to a ground voltage, and the gate of the third NMOS transistor is connected to the first voltage.

10. The semiconductor memory device of claim 9, wherein the word line drivers each further include a second NMOS transistor, a first signal is supplied to the gate of the second NMOS transistor, and a second signal is supplied to the source of the second NMOS transistor, and the drain of the second NMOS transistor is connected to the drain of the second PMOS transistor.

11. The semiconductor memory device of claim 7, further comprising:

a word line bias control circuit including a fourth and a fifth PMOS transistor, wherein the source of the fourth PMOS transistor is connected to the first voltage, and the source of the fifth PMOS transistor is connected to a fourth voltage, and the drain of the fourth PMOS transistor and the drain of the fifth PMOS transistor are connected to the source of the first PMOS transistor.

12. The semiconductor memory device of claim 11, wherein
the fourth voltage is lower than the first voltage and is higher than a ground voltage.

13. The semiconductor memory device of claim 12, wherein
the fourth voltage is equal to the third voltage.

14. The semiconductor memory device of claim 11, wherein
the word line bias control circuit further includes a fourth NMOS transistor,
the source of the fourth NMOS transistor is connected to a ground voltage, and
the drain of the fourth NMOS transistor is connected to the drains of the fourth and fifth PMOS transistors.

15. The semiconductor memory device of claim 1, wherein
the word line drivers each include a transistor configured to pull up the corresponding word line to a predetermined voltage, and
when the word line driver activates the word line, the first voltage is supplied to the pull-up transistor, and when the word line is inactivated, a voltage lower than the first voltage is supplied to the pull-up transistor.

16. The semiconductor memory device of claim 1, wherein
the word line drivers each include a transistor configured to pull up the corresponding word line to a predetermined voltage, and
the semiconductor memory device further includes a section configured to selectively supply the first voltage, a ground voltage, or an intermediate voltage between the first voltage and the ground voltage, to the pull-up transistor.

17. The semiconductor memory device of claim 16, wherein
the ground voltage is supplied to the pull-up transistor only during a predetermined period of time after start of resetting of the word line.

18. The semiconductor memory device of claim 17, wherein
the pull-up transistor has a substrate node connected to the source thereof.

* * * * *

UNITED STATES PATENT AND TRADEMARK OFFICE
CERTIFICATE OF CORRECTION

PATENT NO. : 8,345,506 B2
APPLICATION NO. : 13/100939
DATED : January 1, 2013
INVENTOR(S) : Masahisa Iida Page 1 of 1

It is certified that error appears in the above-identified patent and that said Letters Patent is hereby corrected as shown below:

On the Title Page of the Patent:

Item (56) U.S. reference 5,696,721 should be listed

Signed and Sealed this
Fourth Day of June, 2013

Teresa Stanek Rea
*Acting Director of the United States Patent and Trademark Office*